(12) United States Patent
Liu et al.

(10) Patent No.: US 8,564,340 B2
(45) Date of Patent: Oct. 22, 2013

(54) DUAL PHASE-LOCKED LOOP CIRCUIT AND METHOD FOR CONTROLLING THE SAME

(75) Inventors: Yong-Wang Liu, Shanghai (CN); Wen-cai Lu, Shanghai (CN); Sterling Smith, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 154 days.

(21) Appl. No.: 12/825,438

(22) Filed: Jun. 29, 2010

(65) Prior Publication Data

US 2011/0006820 A1 Jan. 13, 2011

(30) Foreign Application Priority Data

Jul. 7, 2009 (CN) .......................... 2009 1 0157826

(51) Int. Cl.
*H03L 7/06* (2006.01)
(52) U.S. Cl.
USPC ............... 327/156; 327/147; 331/10; 331/17; 375/376
(58) Field of Classification Search
USPC ............ 327/147, 148, 156, 157, 163; 331/10, 331/16, 17, 32; 375/373, 374, 376
See application file for complete search history.

(56) References Cited

U.S. PATENT DOCUMENTS

| | | | | | |
|---|---|---|---|---|---|
| 3,909,735 | A | * | 9/1975 | Anderson et al. ................ | 331/10 |
| 6,163,186 | A | * | 12/2000 | Kurita ............................. | 327/157 |
| 6,320,435 | B1 | * | 11/2001 | Tanimoto ....................... | 327/156 |
| 6,822,987 | B2 | * | 11/2004 | Diaz et al. .................. | 372/38.02 |
| 7,019,570 | B2 | * | 3/2006 | Starr .............................. | 327/156 |
| 7,019,571 | B2 | * | 3/2006 | Lim ............................... | 327/157 |
| 7,177,611 | B2 | * | 2/2007 | Goldman ....................... | 455/260 |
| 7,345,550 | B2 | * | 3/2008 | Bellaouar et al. ............... | 331/17 |
| 7,420,428 | B2 | * | 9/2008 | Pera et al. ........................ | 331/17 |
| 8,212,596 | B2 | * | 7/2012 | Furuta ............................ | 327/156 |
| 2008/0007365 | A1 | * | 1/2008 | Venuti et al. .................. | 331/179 |

FOREIGN PATENT DOCUMENTS

CN 1595806 A 3/2005

OTHER PUBLICATIONS

Chinese Patent Office, Office Action 0910643CN, Oct. 26, 2011, 8 pages.
Herzel et al., "An Integrated CMOS RF Synthesizer for 802.11a Wireless LAN", IEEE Journal of Solid-State Circuits, vol. 38, No. 10, Oct. 2003, pp. 9-12.

* cited by examiner

*Primary Examiner* — Patrick O'Neill
(74) *Attorney, Agent, or Firm* — Edell, Shapiro & Finnan, LLC (57) ABSTRACT

A dual phase-locked loop (PLL) circuit includes a phase/frequency detector, a charge pump, a frequency tuning circuit and an N divider. The frequency tuning circuit includes a coarse-tuning circuit, for coarse-tuning an output frequency of the dual PLL circuit to approximate a target frequency; a fine-tuning circuit, for fine-tuning the output frequency of the dual PLL circuit to the target frequency; and a current control oscillator (CCO), for generating an output signal of the dual PLL circuit. The output frequency of the output signal is equal to the target frequency.

18 Claims, 7 Drawing Sheets

DUAL PHASE-LOCKED LOOP CIRCUIT AND METHOD FOR CONTROLLING THE SAME

CROSS REFERENCE TO RELATED PATENT APPLICATION

This patent application is based on China, P.R.C. patent application No. 200910157826.8 filed on Jul. 7, 2009.

FIELD OF THE INVENTION

The present invention relates to a phase-locked loop (PLL) circuit, and more particularly, to a dual PLL circuit and a method for controlling the same.

BACKGROUND OF THE INVENTION

A frequency synthesizer composed of a PLL circuit is an important approach for generating clock signals. The frequency synthesizer inputs a low-frequency reference signal with high stability and high accuracy to output a series of high-frequency clock signals.

Figure 1:
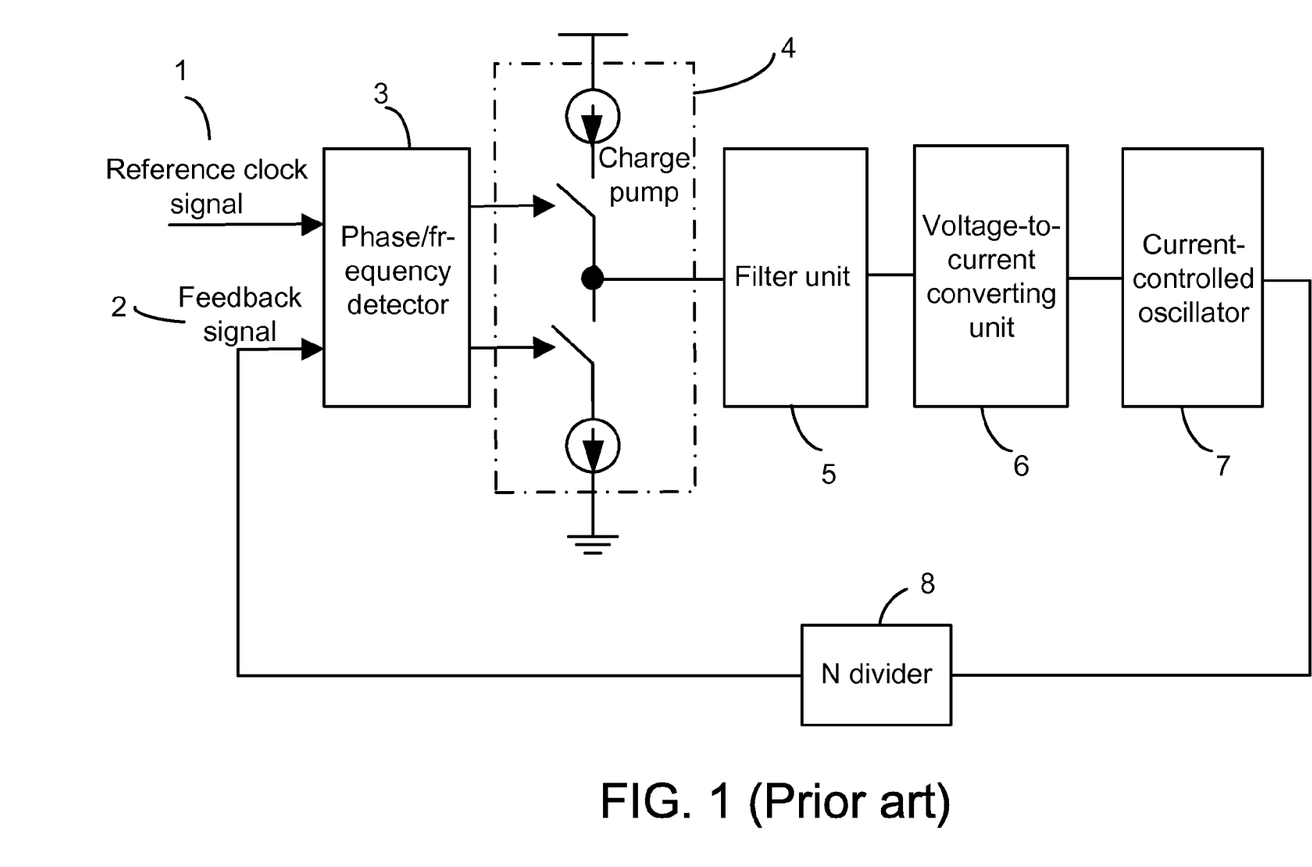
FIG. 1 is a schematic diagram of a conventional PLL circuit.

FIG. 1 is a schematic diagram of a conventional PLL circuit. The operating principle of the conventional PLL circuit is described below. A phase/frequency detector 3 uses a reference clock signal as a reference to compare a frequency and a phase of the reference clock signal with those of a feedback signal outputted from an output end of an N divider 8. Within an operating range of the phase/frequency detector 3, an error signal is generated when any phase (frequency) difference is detected. The error signal, which is directly proportional to a phase difference between the reference clock signal and the feedback signal, controls a charge pump 4 to output a charge pump signal. Alternating components of the charge pump signal are removed by a filter unit 5 to generate a voltage signal. With a voltage-to-current converting unit 6, the voltage signal is converted to a current signal to drive a current-controlled oscillator (CCO) 7 to reduce its frequency in a way that a phase/frequency difference of the current signal is decreased. The frequency of the PLL is then considered locked when phase or frequency difference between the reference clock signal and the feedback signal is reduced to zero.

PLL circuits are required to have good capabilities in restraining noise, which means that smaller loop bandwidth is needed to remove high-frequency noise. Meanwhile, PLL circuits are also expected to output rather high frequencies. The reference frequency is commonly generated by a crystal oscillator that can only handle a limited frequency of tens of MHz. Therefore, when a PLL circuit needs to output a high frequency in GHz, for example, an oscillator of the PLL circuit needs to provide a wider frequency range and a greater gain. According to a relationship that a gain of an oscillator is directly proportional to its loop bandwidth, a greater gain may result in a wider loop bandwidth of the PLL circuit, thus causing a failure in removing excessive noise and degrading the capability of restraining noise. In order to overcome a dilemma between the wide frequency range oscillator and the narrow loop bandwidth of the PLL circuit, a single-path PLL circuit and a PLL circuit with digital control have been developed. In a first solution, the single PLL circuit implements a filter capacitor with extremely large capacitance to reduce the loop bandwidth. In the second solution, the PLL circuit with digital control first selectively activates passive or active components of an oscillator to obtain an appropriate coarse-tuned frequency. When a frequency difference between a reference clock signal and a feedback signal is small enough, the PLL circuit with digital control is switched to a PLL control loop, which has smaller voltage control oscillator (VCO) gain, loop bandwidth and frequency range. Accordingly, the PLL circuit has a large tuning frequency range and a small loop bandwidth to meet requirements of high frequency and narrow bandwidth of a PLL circuit.

Although the foregoing two circuits overcome the dilemma between the wide frequency range and the narrow loop bandwidth to a certain extent, both of the circuits still have their disadvantages. A disadvantage of the single-path PLL circuit is that product cost is increased for the reason that the filter capacitor has to be designed as an off-chip capacitor since it is too large to be integrated into an integrated circuit (IC). A disadvantage of the PLL circuit with digital control is that it can not keep track of and adapt to variations of temperature or technique variables. When the temperature or technique variables are modified, the PLL circuit with digital control needs to be periodically switched to lock to the coarse-tuned frequency due to the small tuning frequency range of the PLL control loop, such that not only design complexity of the digital control PLL circuit is increased but also accuracy is reduced.

A main object of the present invention is to provide a dual PLL circuit and a method for controlling the same to solve the foregoing problems.

SUMMARY OF THE INVENTION

An object of the present invention is to provide a dual PLL circuit and a method for controlling the same, which are capable of enlarging a tuning frequency range while maintaining a small loop bandwidth, so as to reduce additional circuits, reduce design complexity of the dual PLL circuit and improve performance of the dual PLL circuit.

A dual PLL circuit is provided according to the present invention. The dual PLL circuit comprises a phase/frequency detector, for generating an error signal; a charge pump, coupled to the phase/frequency detector, for generating a charge pump signal according to the error signal; a coarse-tuning circuit, coupled to the charge pump, for coarse-tuning an output frequency of the dual PLL circuit to approximate a target frequency according to the charge pump signal; a fine-tuning circuit, coupled to the charge pump, for fine-tuning the output frequency of the dual PLL circuit to the target frequency according to the charge pump signal; a current-controlled oscillator (CCO), coupled to the coarse-tuning circuit and the fine-tuning circuit, for generating a PLL output signal having the target frequency; and an N divider, having its one end coupled to the CCO and its other end coupled to the phase/frequency detector, for frequency-dividing the output signal of the PLL circuit by N.

A method for controlling a dual PLL circuit is provided according to the present invention. The method comprises comparing a feedback signal with a frequency clock signal to generate an error signal; generating a charge pump signal according to the error signal; coarse-tuning a frequency of an output signal of the dual PLL circuit to approximate a target frequency according to the charge pump signal; and fine-tuning the frequency of the output signal of the dual PLL circuit to the target frequency according to the charge pump signal.

A dual PLL circuit and a method for controlling the same according to the present invention respectively comprise a coarse-tuning circuit and a coarse-tuning step, which are capable of enlarging a frequency tuning range while maintaining a small loop bandwidth, as well as reducing design complexity of the dual PLL circuit and improving performance of the dual PLL circuit. Further, the coarse-tuning circuit replaces a filter capacitor having large capacitance by a resistor having large resistance to obtain a large time constant and reduce capacitance of a loop filter, so as to prevent the usage of an off-chip capacitor and reduce product cost.

The advantages and spirit related to the present invention can be further understood via the following detailed description and drawings.

DETAILED DESCRIPTION OF THE PREFERRED EMBODIMENT

Figure 2:
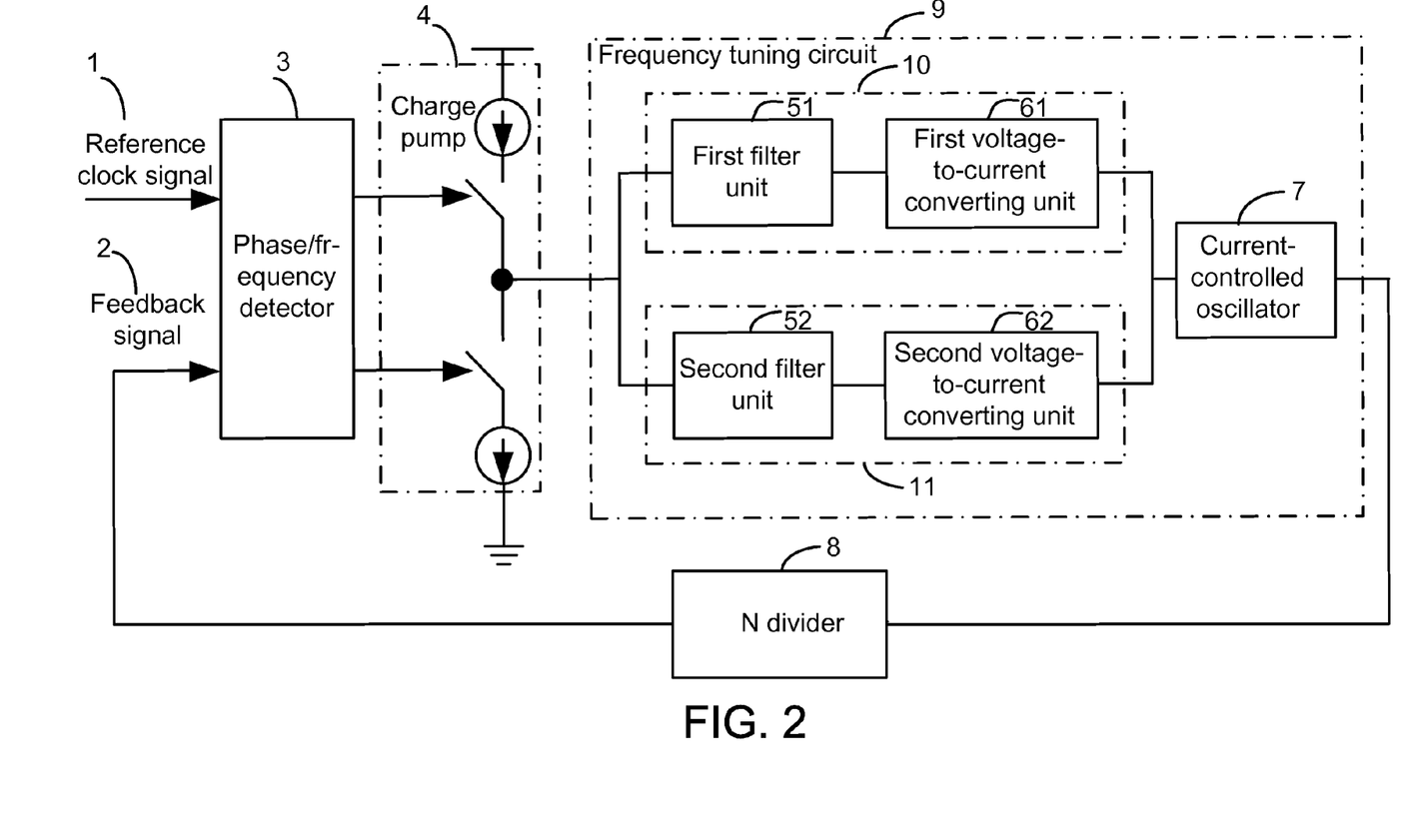
FIG. 2 is a schematic diagram of a dual PLL circuit in accordance with a first embodiment of the present invention.

FIG. 2 shows a schematic diagram of a dual PLL circuit in accordance with a first embodiment of the present invention. The dual PLL circuit according to the present invention is, e.g., a dual PLL circuit with a high frequency and a narrow bandwidth. In this embodiment, the dual PLL circuit comprises a phase/frequency detector 3, a charge pump 4, a frequency tuning circuit 9 and an N divider 8, which are coupled in sequence. A reference clock signal is inputted at one input end of the phase/frequency detector 3. An output signal generated at an output end of the frequency tuning circuit 9 is transmitted to the N divider 8 to generate a feedback signal to be fed into the other input end of the phase/frequency detector 3. The frequency tuning circuit 9 comprises a coarse-tuning circuit 10, a fine-tuning circuit 11, and a CCO 7. The coarse-tuning circuit 10 is connected in parallel to the fine-tuning circuit 11. The CCO 7 has its one end coupled to the coarse-tuning circuit 10 and the fine-tuning circuit 11, and its other end coupled to the N divider 8.

Figure 3:
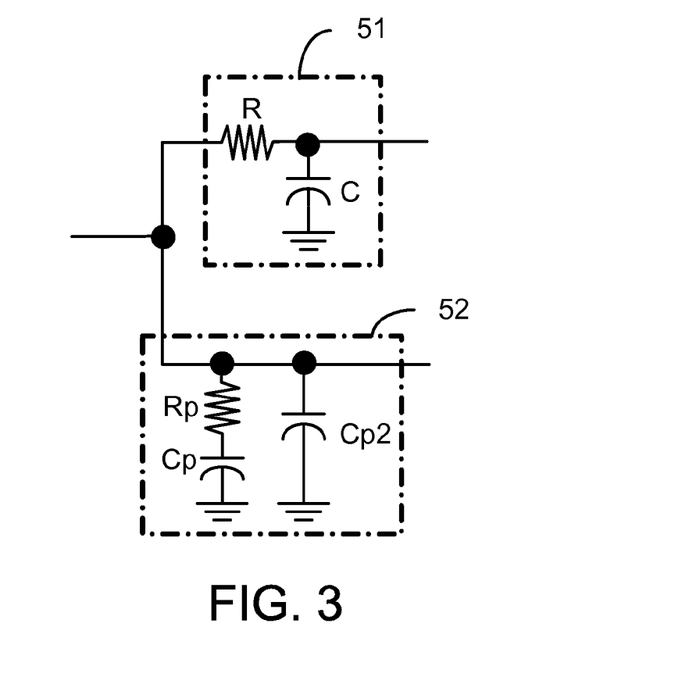
FIG. 3 is a circuit diagram of a first filter unit and a second filter unit of a dual PLL circuit in accordance with the first embodiment of the present invention.

In this embodiment, the coarse-tuning circuit 10 comprises a first filter unit 51 having a large time constant and a first voltage-to-current converting unit 61 having a high gain, and the fine-coarse-tuning circuit 11 comprises a second filter unit 52 having a small time constant and a second voltage-to-current converting unit 62 having a low gain. FIG. 3 shows a circuit diagram of the first filter unit 51 and the second filter unit 52 of a dual PLL circuit in accordance with the first embodiment of the present invention. The first filter unit 51 is a one-stage RC low-pass filter comprising a resistor R and a capacitor C connected in series. In the first filter unit 51, the resistor R has its one end coupled to the charge pump 4, and its other end coupled to the first voltage-to-current converting unit 61; the capacitor C has its one end coupled to the resistor R and the first voltage-to-current converting unit 61, and its other end grounded. A first control voltage drawn from between the resistor R and the capacitor C serves as an input voltage of the first voltage-to-current converting unit 61.

The second filter unit 52 is a two-stage RC filter comprising a resistor Rp and two capacitors Cp, and Cp2. A path formed by the serially connected resistor Rp and the capacitor Cp is connected in parallel to the capacitor Cp2. A second control voltage drawn from between the resistor Rp and the capacitor Cp2 serves as an input voltage of a second voltage-to-current converting unit 62.

Figure 4:
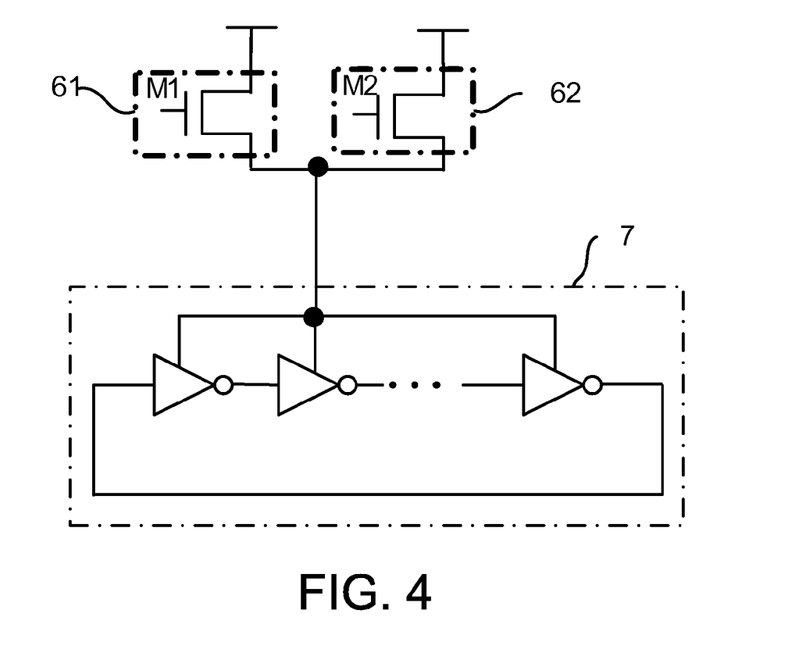
FIG. 4 is a circuit diagram of a first voltage-to-current converting unit, a second voltage-to-current converting unit, and a CCO of a dual PLL circuit in accordance with the first embodiment of the present invention.

FIG. 4 shows a circuit diagram of the first voltage-to-current converting unit 61, the second voltage-to-current converting unit 62, and the CCO 7 of the dual PLL circuit in accordance with the first embodiment of the present invention. The voltage-to-current converting units 61 and 62 are composed of N-path metal oxide semiconductor (NMOS) transistors, and the CCO 7 is a loop oscillator composed of a plurality of inverters. The first voltage-to-current converting unit 61 comprises a transistor M1 having its gate coupled to an output end of the first filter unit 51, and the second voltage-to-current converting unit 62 comprises a transistor M2 having its gate coupled to an output end of the second filter unit 52. A source of the transistor M1 is coupled to a source of the transistor M2 to form parallel source followers to provide a current to the CCO 7. The foregoing description discloses a structure of the frequency tuning circuit 9; however, the present invention is not limited to the foregoing structure. For example, the second filter unit 52 of the frequency tuning circuit 9 may be an active filter—such modification is also within the scope and spirit of the present invention.

An operating principle of the dual PLL circuit according to the first embodiment is discussed below. The phase/frequency detector 3 compares the reference clock signal and the feedback signal respectively inputted at two ends to generate an error signal. The charge pump 4 outputs a charge pump signal according to the error signal, and the charge pump signal is simultaneously inputted to the coarse-tuning circuit 10 and the fine-tuning circuit 11 to respectively pump in or pump out the current in the first filter unit 51 and the second filter unit 52, so as to accomplish frequency tuning by implementing the coarse-tuning circuit 10 and the fine-tuning circuit 11. The charge pump signal flows through the first filter unit 51 and the second filter unit 52 to generate a first control voltage and a second control voltage to respectively control the first voltage-to-current converting unit 61 and the second voltage-to-current converting unit 62 to output currents, which are then added up to control an output frequency of the CCO 7. In this embodiment, an RC circuit (comprising the resistor R and the capacitor C) of the first filter unit 51 has rather a large time constant, which is far greater than that of an RC circuit (comprising the resistor Rp, the capacitors Cp and Cp2) of the second filter unit 52. A voltage-to-current conversion gain of the first voltage-to-current converting unit 61 is greater than that of the second voltage-to-current converting unit 62. A gain ratio between the two voltage-to-current conversion gains is generally about 5 to 20; however, the present invention is not limited to applications within such gain ratio.

In addition, in this embodiment, a time constant ratio between time constants of the first filter unit 51 and the second filter unit 52 is greater than the gain ratio. The coarse-tuning circuit 10 filters and converts the charge pump signal outputted by the charge pump 4 to generate a current control signal having a greater frequency tuning range via the first filter unit 51 and the first voltage-current converting unit 61. Under the control of the current control signal having a greater frequency tuning range, the CCO 7 is allowed to operate within a greater frequency range, so that the frequency of the output signal of the dual PLL circuit can be significantly adjusted within the large, continual range. Accordingly, the frequency of the output signal of the dual PLL circuit can be tuned within a tunable range of the fine-tuning circuit 11 to approximate a target frequency. Meanwhile, the fine-tuning circuit 11 filters and converts the charge pump signal outputted by the charge pump 4 to generate a current control signal having a smaller frequency tuning range via the second filter unit 52 and the second voltage-current converting unit 62. Under the control of the current control signal having a smaller frequency tuning range, the CCO 7 is controlled to operate within a smaller frequency range, so that the frequency of the output signal of the dual PLL circuit is only allowed to be slightly adjusted within the small, continual range until it equals the target frequency.

For example, suppose that the target frequency is 2.1 GHz, the frequency tuning range of the coarse-tuning circuit 10 is 500 MHz to 2 GHz, and the frequency tuning range of the fine-tuning circuit 11 is about 0 MHz to 100 MHz. The coarse-tuning circuit 10 may tune the frequency of the dual PLL circuit to about 2 GHz (a coarse-tuning frequency), and a difference between the coarse-tuning frequency and the target frequency (i.e., 2.1 GHz) is 100 MHz, which is within the frequency tuning range of the fine-tuning circuit 11. Therefore, the fine-tuning circuit 11 simultaneously tunes and stabilizes the coarse-tuned frequency to 2.1 GHz. In conclusion, the coarse-tuning circuit 10 is for significantly adjusting the frequency of the output signal of the dual PLL circuit to approximate the target frequency, the fine-tuning circuit 11 is for slightly adjusting the frequency of the output signal of the dual PLL circuit, and the two circuits are simultaneously functioned to control the dual PLL circuit to output a PLL output signal having the target frequency.

Variations of temperature or technique variables may cause effect on a PLL circuit, especially on a CCO. In a practical application, a same product may be applied in different ambient temperatures, which may influence the CCO of the dual PLL circuit and thus produce a frequency difference to degrade accuracy of the PLL circuit. In the dual PLL circuit according to the embodiment of the present invention, the coarse-tuning circuit 10 has a wider frequency tuning range, and the CCO 7 achieves an object of locking the frequency via currents flowing through the resistor R having large resistance and the capacitor C. Accordingly, when the temperature variable changes, with a constantly changing first control current generated by the first voltage-to-current converting unit 61, the frequency of the output signal of the dual PLL circuit can still fall within the tuning range of the fine-tuning circuit 11 to be further tuned to the target frequency. Through the cooperation between the coarse-tuning circuit 10 and the fine-tuning circuit 11, the dual PLL circuit according to the first embodiment of the present invention is capable of automatically compensating errors incurred by temperature variations.

The technique variations are also inevitable during an IC manufacturing process, so that different final products may be yielded from using a same circuit design due to the technique variations. For example, an oscillator frequency of the CCO 7 may be different from that of an original design. Similar to the principle of compensating the temperature variations, through the cooperation between the coarse-tuning circuit 10 and the fine-tuning circuit 11, the dual PLL circuit according to the first embodiment of the present invention is also capable of automatically compensating errors incurred by technique variations.

From the description above, it is apparent that by tuning the frequency of the output signal of the dual PLL circuit simultaneously with the coarse-tuning circuit 10 and the fine-tuning circuit 11, a wider frequency tuning range of the dual PLL circuit is obtained and the temperature or technique variations are continuously tracked and automatically compensated. Further, the conventional non-continuous method of compensating the temperature or technique variations by periodically switching to the digital control circuit is improved to reduce an overall design complexity.

In the first embodiment, the time constant of the RC circuit (comprising the resistor R and the capacitor C) of the first filter unit 51 is far greater than that of the RC circuit (comprising the resistor Rp and capacitors Cp and Cp2). Compared to the difference between the time constants, a gain difference between the first voltage-to-current converting unit 61 and the second voltage-to-current converting unit 62 has little influence on the loop bandwidth of the dual PLL circuit in a way that it can be overlooked. Accordingly, a stability problem of a PLL circuit is solved and the PLL circuit is provided with a small loop bandwidth as well. The fine-tuning circuit 11 has a smaller voltage-to-current converting gain, i.e., a smaller frequency tuning range, and thus a loop bandwidth the fine-tuning circuit 11 is also small. Accordingly, since the loop bandwidth of the dual PLL circuit is determined by a loop controlled by the fine-tuning circuit 11 having a small loop bandwidth, the dual PLL circuit is correspondingly provided with a small loop bandwidth. Furthermore, the dual PLL circuit enlarges the frequency range of the CCO 7 via the coarse-tuning circuit 10, and, contributable by the filter units, maintains a small loop bandwidth instead of being influenced by the coarse-tuning circuit 10. Therefore, not only the dilemma between a wide frequency tuning range and a narrow loop bandwidth is overcome but also a dual PLL circuit with high frequency and narrow bandwidth is obtained. For example, according to the embodiment of the present invention, the dual PLL circuit simultaneously realizes a 310 KHz loop bandwidth and a 500 MHz to 2 GHz frequency tuning range.

In an IC design, an off-chip capacitor used for providing large capacitance increases product cost, so that the capacitor with large capacitance is avoided as much as possible in a practical application. In this embodiment, the coarse-tuning circuit 10 is introduced to reduce a gain of the CCO 7 demanded by an original PLL loop (the fine-tuning circuit 11), so that capacitance of the capacitors of the second filter unit 52 is reduced and the correspondingly smaller capacitors can be easily integrated to an IC. The large time constant of the RC circuit of the first filter unit 51 is realized by enlarging resistance of the resistor R rather than enlarging capacitance of the capacitor C. Since the resistor R that can be provided with large resistance according to different doping techniques does not occupy much area, the resistor R having large resistance of the coarse-tuning circuit 10 can be easily integrated into an IC. In conclusion, the coarse-tuning circuit 10 effectively solves the problem of increased production cost caused by off-chip capacitors that are needed for obtaining narrow loop bandwidth.

Figure 5:
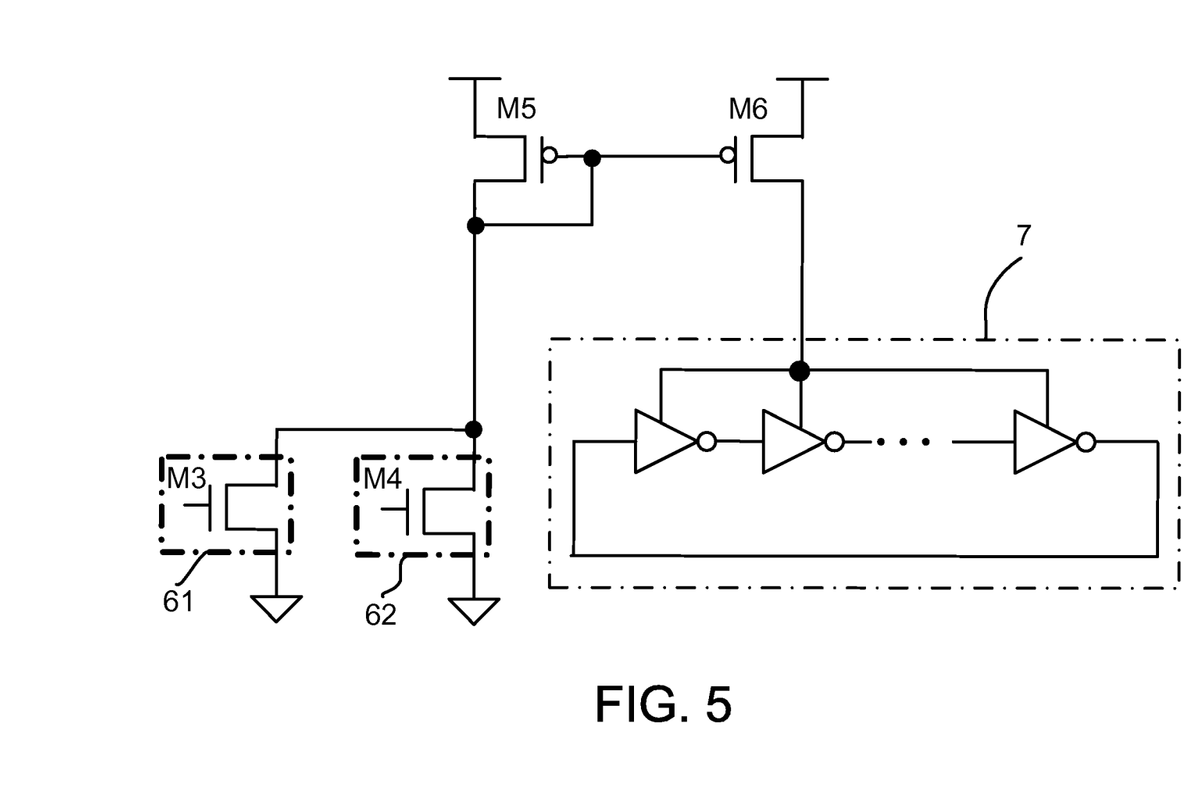
FIG. 5 is a circuit diagram of a first voltage-to-current converting unit, a second voltage-to-current converting unit, and a CCO of a dual PLL circuit in accordance with a second embodiment of the present invention.

FIG. 5 is a circuit diagram of a first voltage-to-current converting unit, a second voltage-to-current converting unit, and a CCO of a dual PLL circuit in accordance with a second embodiment of the present invention. The first voltage-to-current converting unit 61 and the second voltage-to-current converting unit 62 respectively comprise NMOS transistors M3 and M4, and the CCO 7 is a loop oscillator comprising a plurality of inverters. A difference between the transistors in the first embodiment and the second embodiment is that, the transistors M3 and M4 in the second embodiment are coupled to two P-channel metal oxide semiconductor (PMOS) transistors M5 and M6 to form two mirror current sources in parallel, and two currents generated by two voltage-to-current converting units 61 and 62 are added up to generate a control current needed by the CCO 7. The architecture of a dual PLL circuit according to the present invention is not limited to that of the second embodiment illustrated in FIG. 5. The operating principle of the second embodiment is the same as that of the first embodiment, and same result and effect are obtained from implementing the dual PLL circuit of the second embodiment using a same analysis of the first embodiment, so that detailed description of this embodiment is not disclosed for brevity.

Figure 6:
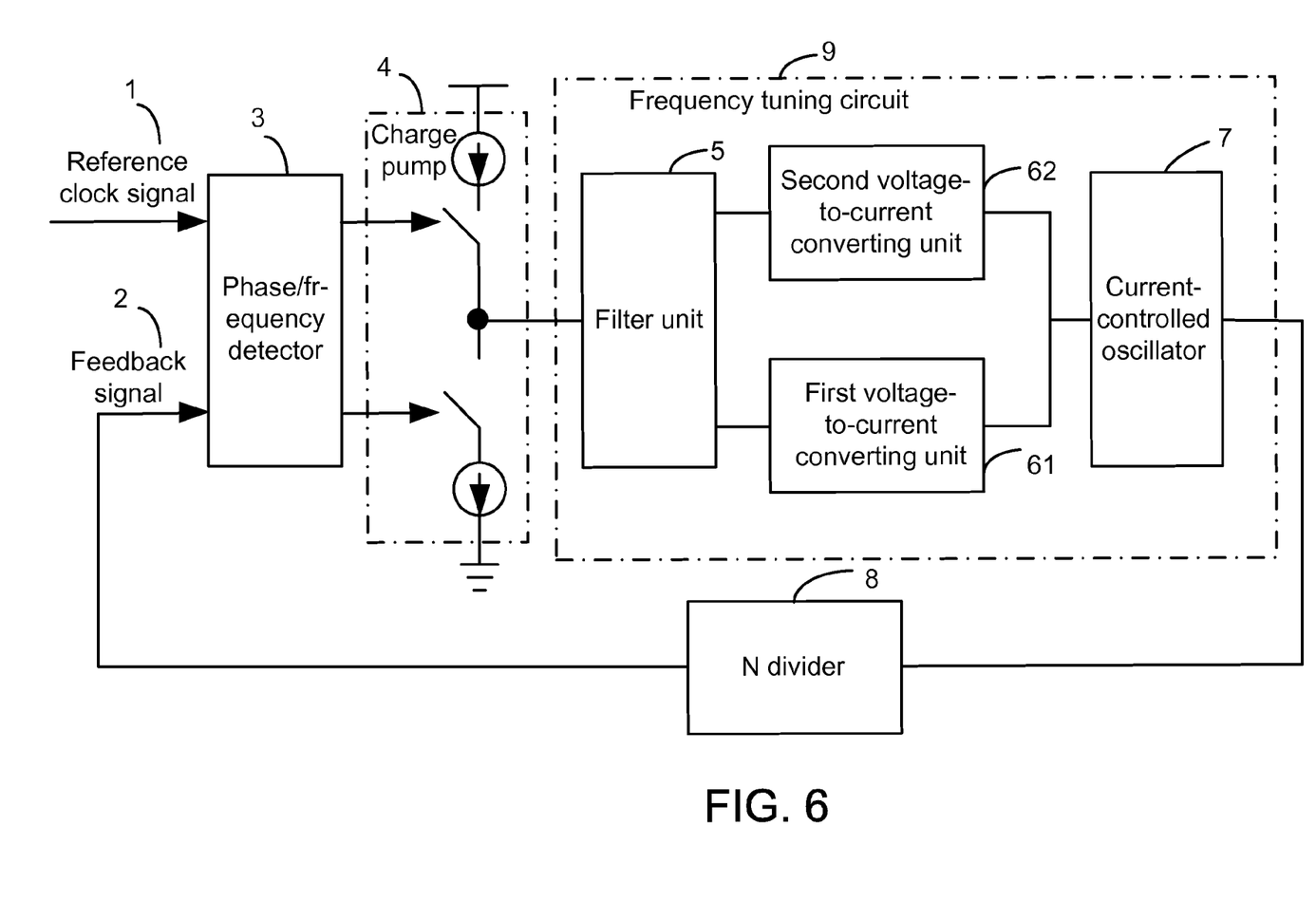
FIG. 6 is a schematic diagram of a dual PLL circuit in accordance with a third embodiment of the present invention.

FIG. 6 is a schematic diagram of a dual PLL circuit in accordance with a third embodiment of the present invention. In this embodiment, the dual PLL circuit comprises a phase/frequency detector 3, a charge pump 4, a frequency tuning circuit 9 and an N divider 8, which are coupled in sequence. A reference clock signal is inputted to one input end of the phase/frequency detector 3. An output signal generated at an output end of the frequency tuning circuit 9 is transmitted to the N divider 8 to generate a feedback signal to be fed into another input end of the phase/frequency detector 3.

Figure 7:
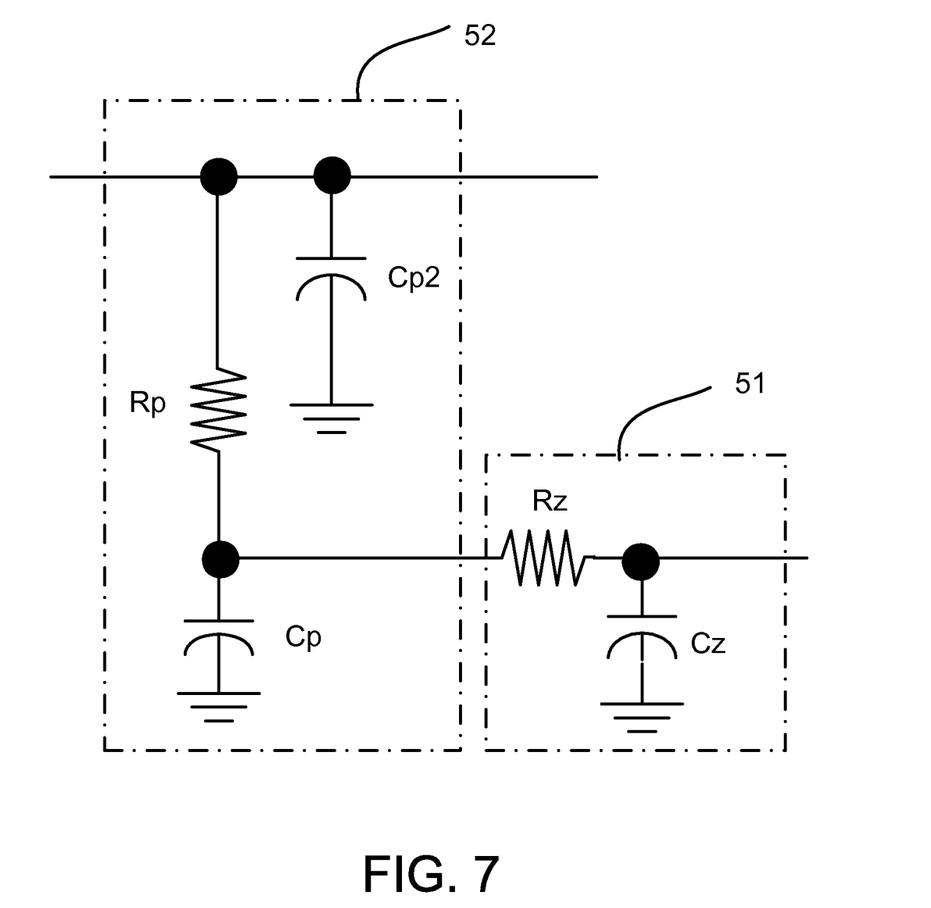
FIG. 7 is a schematic diagram of a first filter unit and a second filter unit of a dual PLL circuit in accordance with the third embodiment of the present invention.

In this embodiment, the frequency tuning circuit 9 of the dual PLL circuit comprises a filter unit 5 that is different from the first filter unit 51 and the second filter unit 52 described in the first embodiment. FIG. 7 shows a schematic diagram of the filter unit 5 in accordance with a third embodiment of the present invention. The filter unit 5 also comprises the first filter unit 51 and the second filter unit 52 as in the first embodiment, but a relationship between the two filter units is different from that of the first embodiment. In this embodiment, the first filter unit 51 is a one-stage RC filter comprising a resistor Rz and a capacitor Cz connected in series, and the second filter unit 52 is a two-stage filter comprising a path composed of a resistor Rp and a capacitor Cp connected in series and a capacitor Cp2 coupled in parallel to the path. The resistor Rz of the first filter unit 51 has its one end coupled between the resistor Rp and the capacitor Cp of the second filter unit 52, and its other end coupled to a first voltage-to-current converting unit 61. The capacitor Cz has its one end coupled between the resistor Rz and the first voltage-to-current converting unit 61, and another end grounded. A first control voltage drawn from between the resistor Rz and the capacitor Cz serves as an input voltage of the first voltage-to-current converting unit 61. A second voltage-to-current converting unit 62 is coupled between the resistor Rp and the capacitor Cp2 of the second filter unit 52 to draw a second control voltage serving as an input voltage of the second voltage-to-current converting unit 62.

Referring to FIG. 6 and FIG. 7, it is apparent that the dual PLL circuit in this embodiment is within scope and spirit of the present invention. The first filter unit 51 of the filter unit 5 is coupled to the first voltage-to-current converting unit 61 to form a coarse-tuning circuit; the second filter unit 52 of the filter unit 5 is coupled to the second voltage-to-current converting unit 62 to form a fine-tuning circuit, which is connected in parallel to the coarse-tuning circuit. The CCO 7 has its one end coupled to the coarse-tuning circuit and the fine-tuning circuit, and its other end coupled to the N divider 8.

The architecture of a PLL circuit according to the present invention is not limited to the third embodiment illustrated in FIG. 6 and FIG. 7. The operating principle of the third embodiment is the same as that of the first or the second embodiment, and same result and effect of the dual PLL circuit are obtained from implementing a same analysis of the first embodiment, so that detailed description of this embodiment is not disclosed for brevity.

A dual PLL circuit in accordance with a fourth embodiment of the present invention comprises the first voltage-to-current converting unit 61 and the second voltage-to-current converting unit 62 illustrated in FIG. 5, and the filter unit 5 illustrated in FIG. 7. In this embodiment, a coarse-tuning circuit comprises the first filter unit 51 illustrated in FIG. 7 and the first voltage-to-current converting unit 61 illustrated in FIG. 5; a fine-tuning circuit comprises the second filter unit 52 illustrated in FIG. 7 and the second voltage-to-current converting unit 62 illustrated in FIG. 5. The coarse-tuning circuit and the fine-tuning circuit simultaneously control the dual PLL circuit to generate an output signal having a target frequency. The structure of a dual PLL circuit according to the present invention is not limited to that of the fourth embodiment. The operating principle of the fourth embodiment is the same as that of the first, the second, or the third embodiment, and same result and effect of the dual PLL circuit are obtained from implementing a same analysis of the first embodiment, so that detailed description of the embodiment is not disclosed for brevity.

Figure 8:
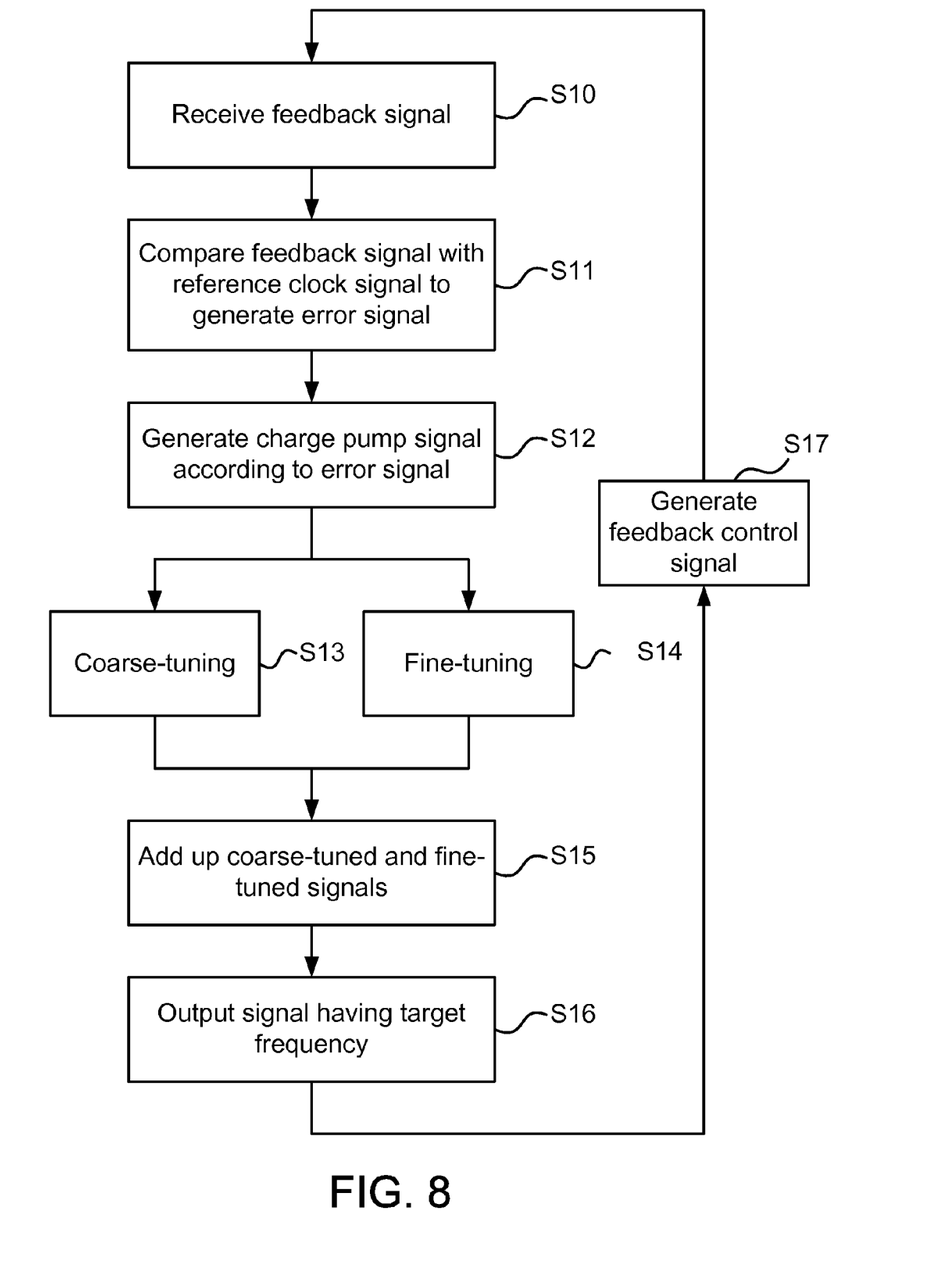
FIG. 8 is a flow chart of a method for controlling a dual PLL circuit in accordance with an embodiment of the present invention.

FIG. 8 is a flow chart of a method for controlling a dual PLL circuit in accordance with an embodiment of the present invention. The controlling method comprises steps below. In Step S10, a feedback signal is received. In Step S11, the feedback signal is compared to a reference clock signal to generate an error signal. In Step S12, a charge pump signal is generated according to the error signal. In Step S13, the charge pump is filtered to generate a first control voltage to be converted to a first control signal, i.e., a frequency of an output signal of the dual PLL circuit is coarse-tuned to approximate a target frequency according to the charge pump signal. In Step S14, the charge pump signal is filtered to generate a second control voltage to be converted to a second control current, i.e., the frequency of the output signal of the dual PLL circuit is fine-tuned to the target frequency according to the charge pump signal. In Step S15, a coarse-tuned output signal (i.e., the first control current) and a fine-tuned output signal (i.e., the second control current) are added up to control the frequency of the output signal of the dual PLL circuit. In Step S16, the added signal is received to generate a PLL output signal having the target frequency. In Step S17, the PLL output signal having the target frequency is frequency divided by N to generate the feedback signal described in Step S10, so as to form a closed PLL loop control.

In Step S10, the feedback signal is generated by N frequency dividing the output signal of the dual PLL circuit. Step S13 and Step S14 are simultaneously performed to control the dual PLL circuit to generate the output signal having the target frequency.

In Step S11, in this embodiment, a phase/frequency detector compares the feedback signal with the reference clock signal to generate the error signal.

In Step S12, a charge pump generates a charge pump signal according to the error signal. The charge pump signal is simultaneously processed in Step S13 and Step S14, and a majority of the charge pump signal is processed in Step S13, i.e., the coarse-tuning step. In the foregoing four embodiments of the present invention, the charge pump signal outputted by the charge pump is divided into two parts, which are respectively inputted into the coarse-tuning circuit and the fine-tuning circuit to control the two circuits to pump in or pump out currents, so as to accomplish frequency tuning by implementing the coarse-tuning circuit and the fine-tuning circuit.

In Step S13, i.e., the coarse-tuning step, high frequency components of the majority of the charge pump signal are removed to generate the first control voltage to be converted to the first control current for controlling and tuning the frequency of the output signal of the dual PLL circuit. In Step S13, the frequency of the output signal of the dual PLL circuit can be significantly adjusted within a large, continual range to approximate the target frequency, such that the output signal has a larger frequency tuning range, while a difference between the coarse-tuned frequency from the coarse-tuning step and the target frequency falls within a fine-tuning frequency range.

In Step S14, i.e., the fine-tuning step, high frequency components of a minority of the charge pump signal are removed to generate the second control voltage to be converted to the second control current, which is for controlling and tuning the frequency of the output signal of the dual PLL circuit to the target frequency. In Step S14, the frequency of the output signal of the dual PLL circuit is only allowed to be slighted adjusted within the small, continual range until it reaches the target frequency, such that the output signal has a smaller frequency tuning range. By simultaneously performing Step S13 and Step S1, frequency differences incurred by temperature and technique variations are compensated.

In Step S15, the first control current generated in Step S13 and the second control current generated in Step S14 are added up to provide a control signal for a CCO of the dual PLL circuit. In the first and third embodiments of the present invention, the first control current and the second control current are added up by a parallel connection; in the second and fourth embodiments, the first control current and the second control current are added up by mirror duplication.

In conclusion, in a method for controlling a dual PLL circuit according to the present invention, a PLL output signal is frequency divided to generate a feedback signal; the feedback signal is compared with a reference clock signal to generate an error signal, which is processed by a charge pump to generate a charge pump signal; and the charge pump signal is filtered and converted to a control signal for tuning the PLL output signal to form a closed PLL control. The method further comprises a coarse-tuning step and a fine-tuning step, which are for simultaneously controlling the dual PLL circuit. In the coarse-tuning step, a frequency of an output signal of the dual PLL circuit is coarse tuned to approximate a target frequency according to the charge pump signal; in the fine-tuning step, the frequency of the output signal of the dual PLL circuit is fine tuned to the target frequency according to the charge pump signal. The coarse-tuning step and the fine-tuning step are simultaneously performed to lock the frequency of the output signal of the dual PLL circuit at the target frequency.

The method for controlling a dual PLL circuit according to the present invention is capable of enlarging a frequency tuning range while maintaining a small loop bandwidth, reducing design complexity of the dual PLL circuit and improving performance of the dual PLL circuit. A coarse-tuning step is implemented to reduce capacitance of a loop filter, so as to avoid using an off-chip capacitor and reduce product cost.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A dual phase locked loop (PLL) circuit with an output signal, comprising:
   a phase/frequency detector, for generating an error signal;
   a charge pump, coupled to the phase/frequency detector, for generating a charge pump signal according to the error signal;
   a coarse-tuning circuit, coupled to the charge pump, for coarse-tuning a frequency of the output signal of the dual PLL circuit to approximate a target frequency, the course-tuning circuit comprising:
   a first filter unit, coupled to the charge pump, for removing high frequency components of the charge pump signal to generate a first control voltage; and
   a first voltage-to-current converting unit, coupled to the first filter unit, for converting the first control voltage to a first control current;
   a fine-tuning circuit, coupled to the charge pump, for fine-tuning the frequency of the output signal of the dual PLL circuit to the target frequency, the fine-tuning circuit comprising:
   a second filter unit, coupled to the charge pump, for removing high frequency components of the charge pump signal to generate a second control voltage; and
   a second voltage-to-current converting unit, coupled to the second filter unit, for converting the second control voltage to a second control current;
   a current control oscillator (CCO), coupled to the coarse-tuning circuit and the fine-tuning circuit, for generating the output signal having the target frequency, the current control oscillator being a loop oscillator comprising a plurality of inverters;
   an N divider, coupled to the CCO and the phase/frequency detector, for frequency-dividing by N the frequency of the output signal of the dual PLL circuit,
   wherein the first filter unit comprises a resistor having a predetermined resistance and a capacitor connected in series as a first RC circuit, the second filter unit comprises a second RC circuit, and as a result of the predetermined resistance the first RC circuit has a greater time constant than that of the second RC circuit; and
   wherein the first voltage-to-current converting unit comprises a first N-path metal oxide semiconductor (NMOS) transistor, the second voltage-to-current converting unit comprises a second NMOS transistor, the first transistor has its gate coupled to a first output end of the first filter unit and the second transistor has its gate coupled to a second output end of the second filter unit, a source of the first transistor is coupled to a source of the second transistor, so that the first transistor and the second transistor form a parallel source follower to provide a total current to the CCO to control the CCO to generate the output signal of the dual PLL circuit having the target frequency.

2. The dual PLL circuit as claimed in claim 1, wherein, the first control current and the second control current are added up and inputted to the CCO to control the CCO to generate the output signal of the dual PLL circuit having the target frequency.

3. The dual PLL circuit as claimed in claim 2, wherein the second filter unit is a passive filter or an active filter.

4. The dual PLL circuit as claimed in claim 2, wherein the first control current and the second control current are added up via a source follower circuit.

5. The dual PLL circuit as claimed in claim 2, wherein a time constant ratio between the first filter unit and the second filter unit is greater than a gain ratio between the first voltage-to-current converting unit and the second voltage-to-current converting unit.

6. The dual PLL circuit as claimed in claim 1, wherein the first control voltage is drawn from between the resistor and the capacitor of the first filter unit.

7. The dual PLL circuit as claimed in claim 1, wherein the coarse-tuning circuit has a greater gain than the fine-tuning circuit.

8. The dual PLL circuit as claimed in claim 1, wherein a gain ratio between the coarse-tuning circuit and the fine-tuning circuit is 5 to 20.

9. The dual PLL circuit as claimed in claim 1, wherein the coarse-tuning circuit and the fine-tuning circuit simultaneously control the dual PLL circuit to generate the output signal having the target frequency.

10. A method for controlling a dual PLL circuit with an output signal, comprising:
    comparing a feedback signal and a reference clock signal to generate an error signal;
    generating a charge pump signal according to the error signal;
    coarse-tuning a frequency of the output signal through a first filter and a first voltage-to-current converting unit to approximate a target frequency according to the charge pump signal, the first filter removing high frequency components of the charge pump signal to generate a first control voltage, and the first voltage-to-current converting unit, coupled to the first filter, converting the first control voltage to a first control current; and
    fine-tuning the frequency of the output signal through a second filter and a second voltage-to-current converting unit to the target frequency according to the charge pump signal, the second filter removing high frequency components of the charge pump signal to generate a second control voltage, and the second voltage-to-current converting unit, coupled to the second filter unit, converting the second control voltage to a second control current;
    generating the output signal of the dual PLL circuit with a current controlled oscillator (CCO), the current controlled oscillator being a loop oscillator comprising a plurality of inverters;
    wherein the first filter comprises a resistor having a predetermined resistance and a capacitor connected in series as a first RC circuit, the second filter comprises a second RC circuit, and as a result of the predetermined resistance the first RC circuit has a greater time constant than that of the second RC circuit; and
    wherein the first voltage-to-current converting unit comprises a first N-path metal oxide semiconductor (NMOS) transistor, the second voltage-to-current converting unit comprises a second NMOS transistor, the first transistor has its gate coupled to a first output end of the first filter unit and the second transistor has its gate coupled to a second output end of the second filter unit, a source of the first transistor is coupled to a source of the second transistor, so that the first transistor and the second transistor form a parallel source follower.

11. The method as claimed in claim 10, wherein the feedback signal is generated by frequency dividing the output signal of the dual PLL circuit, and the coarse-tuning step and the fine-tuning step are simultaneously performed to control the dual PLL circuit to generate the output signal having the target frequency.

12. The method as claimed in claim 10, further comprising:
    dividing the charge pump signal into two parts, which are respectively processed in the coarse-tuning step and the fine-tuning step, with a majority of a current of the charge pump signal being processed in the coarse-tuning step.

13. The method as claimed in claim 12, further comprising:
    adding up an output signal generated from the coarse-tuning step and an output signal generated from the fine-tuning step to control the frequency of the output signal of the dual PLL circuit.

14. The method as claimed in claim 13, wherein the output signals respectively generated from the coarse-tuning step and the fine-tuning step are added up by the parallel source follower.

15. The method as claimed in claim 10, wherein in the coarse-tuning step, the frequency of the output signal of the dual PLL circuit is significantly adjusted in a continual range to realize coarse-tuning the frequency of the output signal.

16. The method as claimed in claim 10, wherein in the fine-tuning step, the frequency of the output signal of the dual PLL circuit is slightly adjusted in a continual range to realize fine-tuning the frequency of the output signal of the dual PLL circuit.

17. The method as claimed in claim 10, further comprising:
    adding up an output signal generated from the coarse-tuning step and an output signal generated from the fine-tuning step to control the frequency of the output signal of the dual PLL circuit.

18. The method as claimed in claim 17, wherein the output signals respectively generated from the coarse-tuning step and the fine-tuning step are added up by the parallel source follower.

* * * * *